United States Patent
Burgio (10) Patent No.: US 8,325,853 B2
(45) Date of Patent: Dec. 4, 2012

(54) FULLY DIGITAL FREQUENCY LOCKED LOOP/PHASE LOCKED LOOP METHOD AND SYSTEM HAVING A SHORT LOCKING TIME

(75) Inventor: Carmelo Burgio, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1672 days.

(21) Appl. No.: 11/344,972

(22) Filed: Jan. 31, 2006

(65) Prior Publication Data
US 2006/0203937 A1    Sep. 14, 2006

(30) Foreign Application Priority Data
Jan. 31, 2005 (IT) .............................. MI2005A0138

(51) Int. Cl.
*H04L 27/14* (2006.01)
(52) U.S. Cl. ........ 375/326; 375/328; 375/373; 375/375; 375/376; 375/327
(58) Field of Classification Search ................. 375/326, 375/317, 376; 332/127, 128
See application file for complete search history.

(56) References Cited

U.S. PATENT DOCUMENTS

| | | | |
|---|---|---|---|
| 6,515,553 B1 * | 2/2003 | Filiol et al. | 332/127 |
| 6,661,293 B2 * | 12/2003 | Paananen | 331/10 |
| 7,170,964 B2 * | 1/2007 | Kocaman et al. | 375/376 |
| 7,177,611 B2 * | 2/2007 | Goldman | 455/260 |
| 7,330,079 B2 * | 2/2008 | Williams et al. | 331/34 |

* cited by examiner

*Primary Examiner* — David Ometz
*Assistant Examiner* — Qutbuddin Ghulamali
(74) *Attorney, Agent, or Firm* — Graybeal Jackson, LLP (57) ABSTRACT

Embodiments of the present invention relate to a system for clock synthesis or data timing recovery. No analog continuous time oscillator is required, all the building blocks of a Frequency Locked Loop/Phase Locked Loop belonging in the digital discrete time domain. From a system-level perspective, the system is characterized by its strong non-linear behavior due to the intrinsic nature of some building blocks. This inherent non-linearity is responsible for some unusual, attractive property of the complete system. The system is able to multiply the input frequency clock by an arbitrarily large factor, ensuring in any case the convergence of the algorithm in two reference clock cycles.

18 Claims, 7 Drawing Sheets

FULLY DIGITAL FREQUENCY LOCKED LOOP/PHASE LOCKED LOOP METHOD AND SYSTEM HAVING A SHORT LOCKING TIME

PRIORITY CLAIM

This application claims priority from Italian patent application No. MI2005A 000138, filed Jan. 31, 2005, which is incorporated herein by reference.

TECHNICAL FIELD

Embodiments of the present invention relate generally to a fully digital, very short lock time Frequency Locked Loop (FLL)/Phase Locked Loop (PLL) method and system. More particularly, embodiments of the present invention relate to a system for clock synthesis or data timing recovery able to multiply the input frequency clock by an arbitrarily large factor thus providing a high frequency output clock, N times faster than a given reference clock.

BACKGROUND

Figure 1:
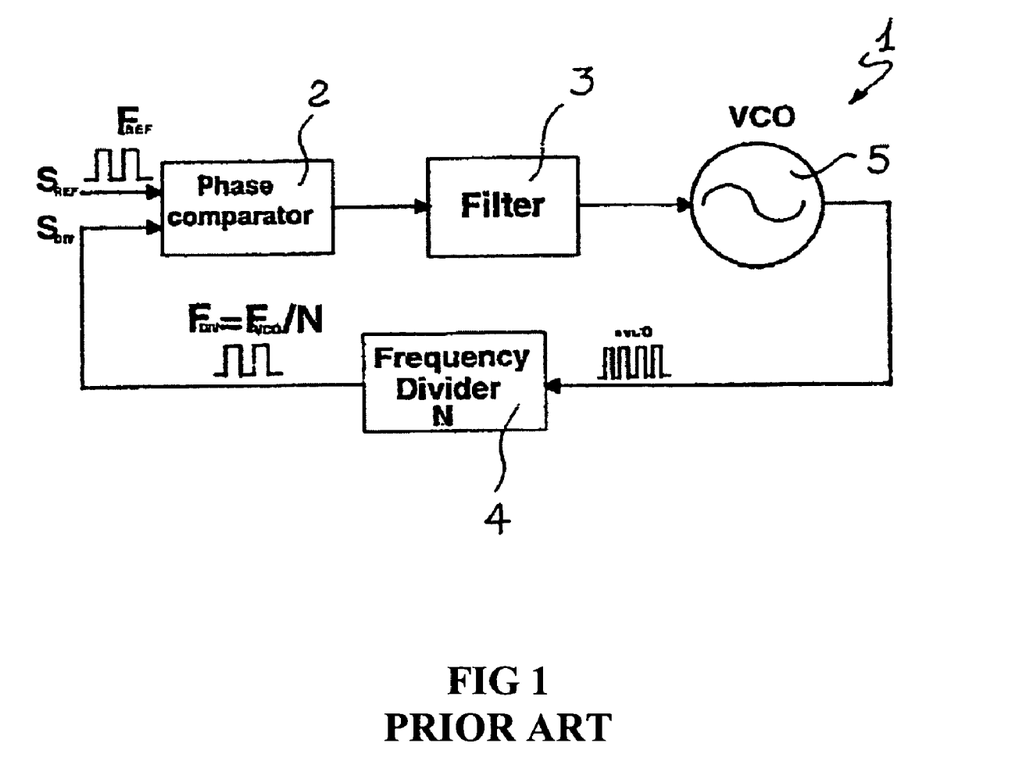
FIG. 1 shows in schematic diagram blocks a conventional phase locked loop.

As is well known in this specific technical field, a Phase Locked Loop (PLL), as generally shown at 1 in FIG. 1, comprises essentially a phase comparator 2, a filter 3, a frequency divider 4, and a voltage controlled oscillator VCO 5.

With the phase locked loop (PLL) 1 locked to a periodic input signal at a frequency Fref, the frequency Fvco of the voltage controlled oscillator VCO 5 is equal to that of the input signal multiplied by a division ratio N of the frequency divider 4.

The phase comparator 2 generates a signal which is proportional to the phase difference between the input signal and the output signal of the frequency divider. This signal modifies, through the filter 3, the control voltage of the voltage controlled oscillator VCO 5, and consequently its frequency Fvco as well, thereby bringing the output frequency Fdiv of the frequency divider 4 to the same value as the input frequency Fref.

The characteristic parameters according to which a phase locked loop (PLL) 1 is evaluated are the following:
accuracy of the generated frequency;
phase noise;
glitch rejection;
locking time; and
loop phase margin.

The frequency accuracy of the voltage controlled oscillator VCO 5 is dependent on the frequency accuracy of the input signal and the accuracy of the phase comparator 2.

A PLL has two main behaviors: in tracking mode the PLL has already locked on to the signal; what the PLL does to keep itself aligned with the incoming signal in light of frequency and phase disturbance in this modality.

On the contrary, in acquisition mode the PLL is either out of clock or in start up phase. This phase is difficult to analyze and understand but the good performance of a system is also based on the time spent to get all parameters to lock the PLL, the rapidity of the convergence.

Up to now the prior systems for clock synthesis or data timing recovery don't provide any solution for completely skipping the transient time that is needed for the locking of the system. More particularly, all prior art solutions present a drawback due to the presence of analogous components requiring a predetermined time to get all parameters for locking the PLL.

SUMMARY

One embodiment of the present invention is a system for clock synthesis or data timing recovery based on fully digital components operating in the discrete time domain and able to multiply the input frequency clock by an arbitrarily large factor without using an analog, continuous time oscillator, thus completely skipping the transient time for the locking of the system. According to this embodiment, all the building blocks of this Frequency Locked Loop/Phase Locked Loop belong to the digital discrete time domain.

Another embodiment of the present invention is based on the remarkable finding that its strong non-linear behavior, due to the intrinsic nature of some building blocks, is responsible for some unusual, attractive properties of the complete system.

In other words, one embodiment of the present invention is able to multiply the input frequency clock by an arbitrarily large factor, ensuring in any case the convergence of the algorithm in two reference clock cycles.

BRIEF DESCRIPTION OF THE DRAWINGS

Further features and advantages of methods and systems according to embodiments of the present invention will be more apparent from the following description of an embodiment thereof given by way of non-limiting example with reference to the attached drawings.
In the drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 2:
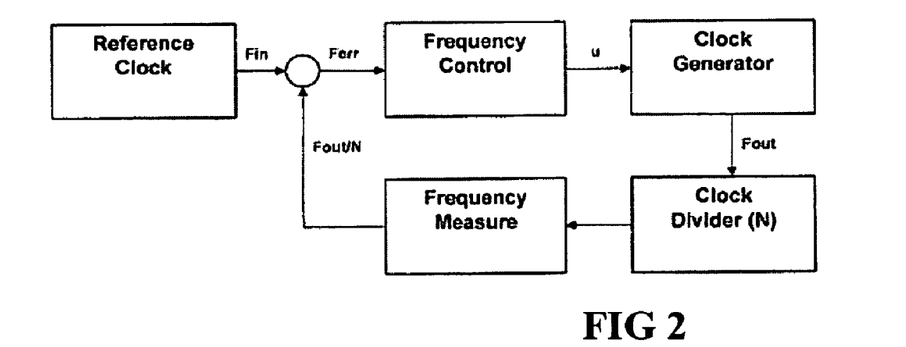
FIG. 2 depicts in schematic diagram blocks the high level, conceptual structure of the system according to an embodiment of the present invention.
Figure 3:
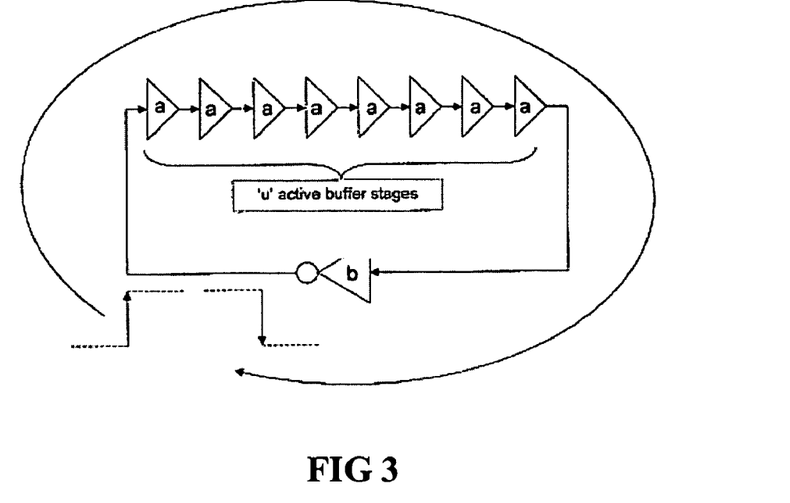
FIG. 3 details the conceptual structure of a Digital Controlled Oscillator according to an embodiment of the present invention.
Figure 4:
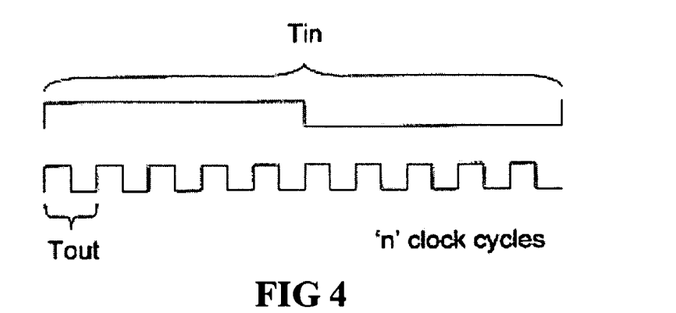
FIG. 4 shows schematically a simple counter, counting the number of the output clock pulses into one period of the input reference.
Figure 6:
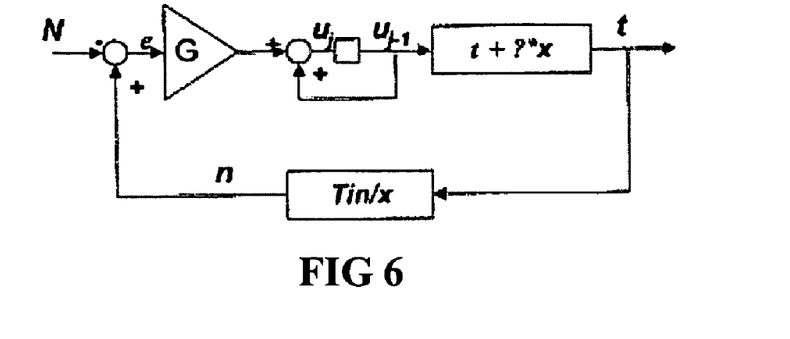
FIG. 6 is a schematic model view of a complete system according to an embodiment of the present invention.
Figure 7:
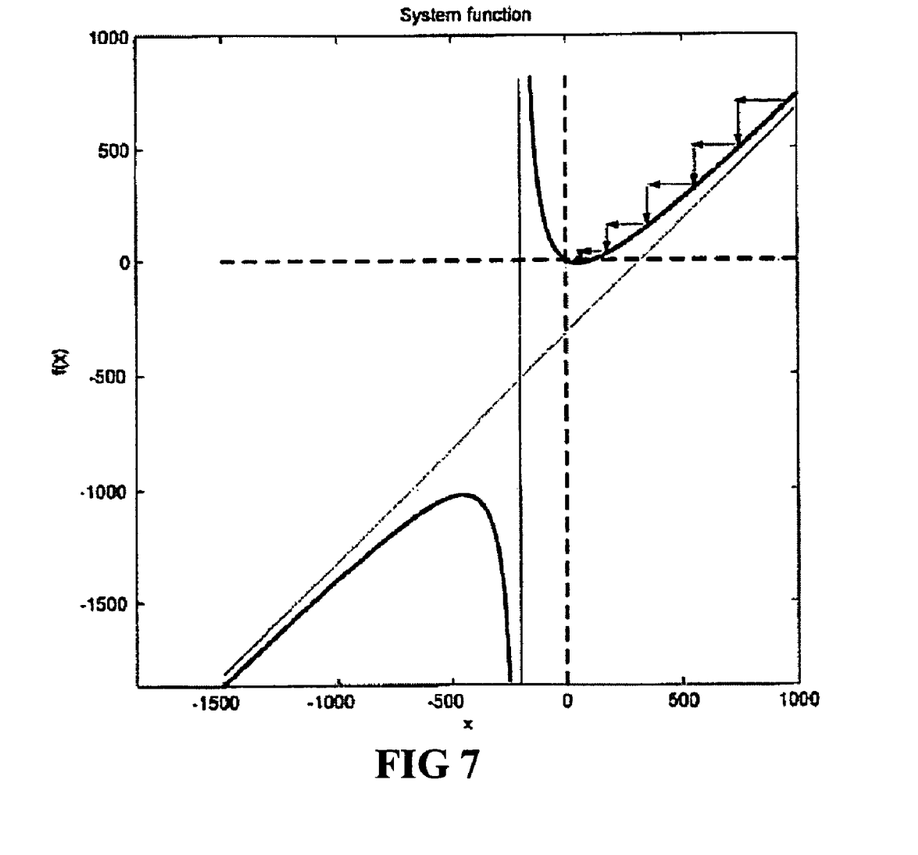
FIG. 7 is a plot of the function where y is a hyperbola representing the system function.

With specific reference to the drawings, and particularly with respect to the FIGS. 2 and 6, a system for clock synthesis or data timing recovery according to an embodiment of the present invention is globally shown at 1.

Unless explicitly stated in the following, we will refer to the system in the described embodiment of the invention as a frequency locked loop (FLL) system. The PLL implementation is a straightforward extension of such a system.

The task of the FLL system is the generation of a high frequency clock, N times faster than a given reference clock.

Some useful symbol definitions in this context are:
Fin: the input reference clock frequency
Tin: the input reference clock period
N: the ratio between output and input clock frequency, >1
Fout: the output frequency, N*Fin
Tout: the output period, Tin/N
Ferr: the frequency error, Fin−Fout/N
u: the clock generator control word The system 1 includes a Clock Generator that generates the output, high frequency clock, Fout. The frequency of the clock generator is divided by N in a Clock Divider and is measured by a Frequency Measure block. The result of this measure is compared with a Reference Clock wherein a frequency error, Ferr, is evaluated.

This value Ferr is used by a Frequency Control block to generate a control word for the selection of the proper oscillation frequency Fout.

This feedback system evolves converging, after a transient period, to a stable configuration having Ferr=0 and then Fout=N*Fin, the desired result.

The Clock Generator of the present invention has fully digital architecture and it is based on the ring oscillator structure detailed in FIG. 2.

The basic building block is a particular Digital Controlled Oscillator (DCO), basically comprising a chain of buffers and an inverting stage. The number of the buffers, and then the delay, in the ring can be changed accordingly to the control word, 'u', modulating the oscillation frequency, Fout, as shown in FIG. 6.

It is important that a change in the control word does not generate any glitch in the ring oscillator, because that glitch will remain into the ring forever. This is intrinsically ensured by the structure of the particular DCO cell proposed.

It may be safely assumed that each buffer stage has a delay time of 'a' sec., while the inverting stage has an intrinsic delay time of 'b' sec. The number of active buffers being controlled by the 'u' control word, the wave front (for instance a rising clock edge) traveling through the ring will spend b+a*u seconds to complete a round trip. The second half clock cycle (falling clock edge) will last b+a*u seconds as well.

Then the output clock period is:

$$T_{out} = 2 \cdot (b + a \cdot u)$$

With the positions:

$$\tau = 2 \cdot a$$

$$\kappa = 2 \cdot b$$

the output clock period is:

$$T_{out} = \tau + \kappa \cdot u$$

It is worth pointing out that the period of the output clock is linearly related to the control word. In the following it will be evident that this property plays a fundamental role in the dynamics of the FLL.

The clock divider and the frequency measure blocks shown in FIG. 2 can be collapsed in a single entity, generating as an output the ratio between the actual Fout and Fin. This can be easily accomplished in hardware with a simple counter, counting the number of the output clock pulses into one period of the input reference.

As a first approximation we can state that the measured number of clock pulses, 'n' is:

$$n = \frac{Tin}{Tout} = \frac{Fout}{Fin}$$

but, due to the fact that only an integer number of clock pulses can be detected, we have the more correct relation:

$$n = \text{floor}\left(\frac{Tin}{Tout}\right) = \text{floor}\left(\frac{Fout}{Fin}\right)$$

It is worth pointing out that the measured parameter, 'n', is proportional to the output frequency, and then it is a measure of the reciprocal of the output period, Tout. As a result we have a control variable tuning the period of the output clock, while the measurement is performed on the output frequency. This fact generates the non-linear behavior of the system and, as we will see, introduces the 1/x function into the dynamics of the FLL.

Subtracting the target ratio, 'N', from the measured ratio, 'n', we obtain a measure of the frequency error, Ferr. This quantity feeds the 'Frequency Control' block.

$$\epsilon = n - N$$

The objective of the frequency control block shown in FIG. 2 is the identification of the proper DCO control word in order to generate the target output frequency. This control word has to be identified independently from the technology, physical parameters (temperature), process spread and so on. At the steady state we require zero frequency error, so at least an integrator control is needed into the loop. A very critical point is the gain, 'G', of this integrator stage because, as we will see, this gain will affect the dynamics and the stability of the complete system. More complex control functions affect the behavior of the FLL during the tracking phase, i.e. the ability of the system to follow some changes of the reference clock. In the present analysis we will limit the complexity of the controller to the simple integrator schematized in FIG. 5.

Figure 5:
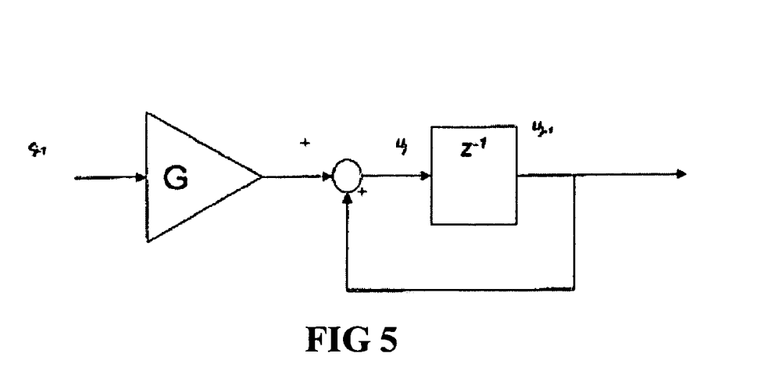
FIG. 5 is a schematic the diagram of an integrator controller.

The integrator is modeled by the following equation:

$$u_j = u_{j-1} + G \cdot \epsilon_{j-1}$$

where:
$u_j$ control word at time 'j'
$u_{j-1}$ control word at time 'j−1'
$\epsilon_{j-1}$ error at time 'j−1'

According to the previous block descriptions, we can sketch the model of the complete system as shown in FIG. 6. In this schematic view we can note that the sign of the feedback is apparently positive but due to the function applied to t, an increase in the output frequency will be compensated with an increase in the control variable u, producing a longer period output clock and vice-versa.

Let us write the system equation for the state variable, u.

$$u_j = u_{j-1} + G \cdot \varepsilon$$

$$u_j = u_{j-1} + G \cdot \left(\frac{Tin}{t} - \frac{Tin}{Tout}\right)$$

$$u_j = u_{j-1} + G \cdot \left(\frac{Tin}{\tau + \kappa \cdot u_{j-1}} - \frac{Tin}{Tout}\right)$$

The system evolves autonomously according to the previous iterated equation. The state variable can converge to the correct value or can diverge without limit (at least in the math model). It is immediate to calculate the fixed point, u* of this system, imposing the condition $\varepsilon=0$.

$$\frac{Tin}{\tau + \kappa \cdot u^*} - \frac{Tin}{Tout} = 0$$

Then we can solve it for the equilibrium point:

$$u^* = \frac{Tout - \tau}{\kappa}$$

In order to analyze the stability of the equilibrium point, we can normalize the parameters and apply a translation of coordinates, moving the equilibrium point in the origin.

$$u_j = u_{j-1} + G \cdot \left(\frac{Tin}{\tau + \kappa \cdot u_{j-1}} - \frac{Tin}{Tout}\right)$$

$$u_j = u_{j-1} + G \cdot \frac{Tin}{Tout} \cdot \left(\frac{1}{\frac{\tau}{Tout} + \frac{\kappa}{Tout} \cdot u_{j-1}} - 1\right)$$

Let us define:

$$\alpha \equiv \frac{\tau}{Tout}$$

$$\beta \equiv \frac{\kappa}{Tout}$$

$$\lambda \equiv G \cdot \frac{Tin}{Tout}$$

then we have:

$$u_j = u_{j-1} + \lambda \cdot \left(\frac{1}{\alpha + \beta \cdot u_{j-1}} - 1\right) \quad u^* = \frac{1-\alpha}{\beta}$$

Translating the equilibrium point into the origin:

$$x \equiv u - \frac{1-\alpha}{\beta}, \quad u \equiv x + \frac{1-\alpha}{\beta}$$

and substituting it into the system equation, we have:

$$x_j = x_{j-1} - \lambda \cdot \frac{\beta \cdot x_{j-1}}{1 + \beta \cdot x_{j-1}}$$

We will refer to this equation as "the system function", relating the present state with the next state:

$$x_j = f(x_{j-1})$$

$$f(x) = x - \lambda \cdot \frac{\beta \cdot x}{1 + \beta \cdot x}$$

This equation is iterated in time, generating the system evolution.

It is quite interesting to note that the system equation, and then its stability, does not depend on the intrinsic delay time $\tau$ of the ring oscillator, but it is related only to the variable delay $\kappa$, technology dependent, the integrator gain G, the multiplication factor N, and the output frequency Fout.

Due to the control mechanism of the system, there is no algorithmic limit to the multiplication factor, N. The system will converge anyway, selecting the appropriate gain G.

Figure 8:
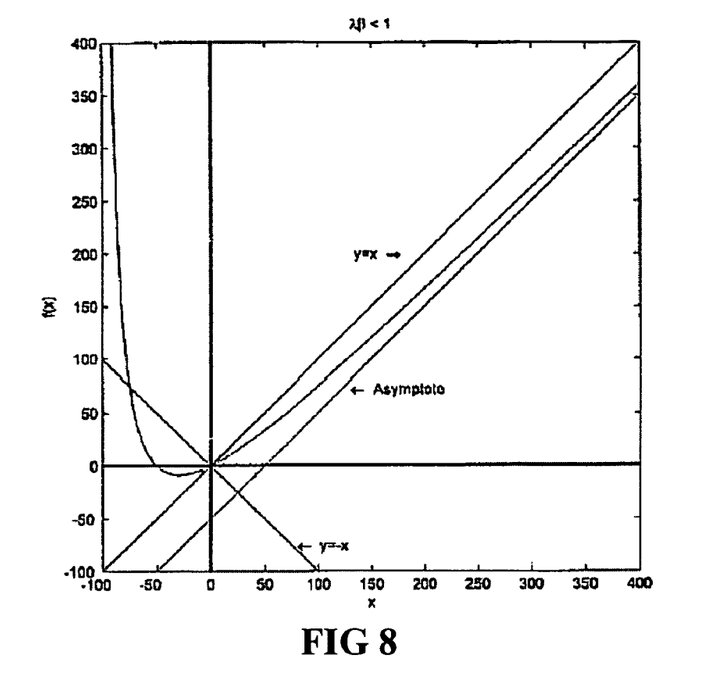
FIG. 8 shows the behavior of the system function (the upper branch only) with values of parameters $0<\lambda\cdot\beta<1$.
Figure 9:
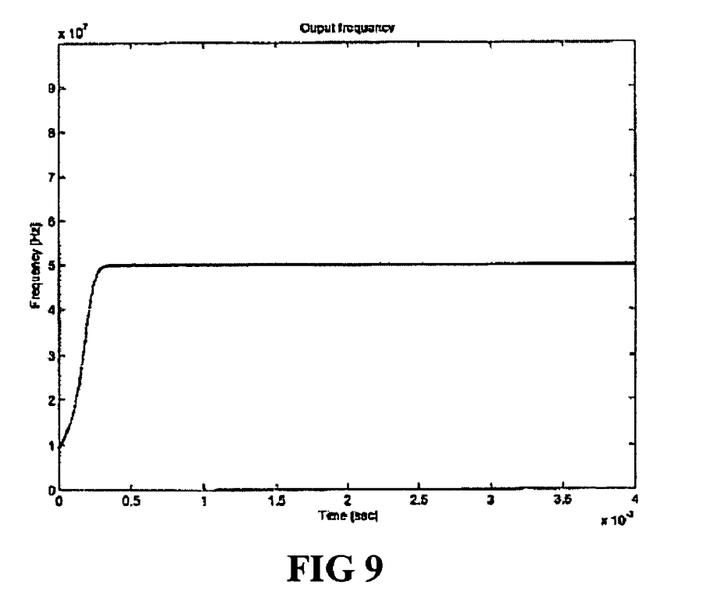
FIG. 9 shows the behavior of the system function (the upper branch only) with different values of parameter $0<\lambda\cdot\beta<1$.

The system function is a hyperbola with an oblique asymptote as sketched in FIG. 8. The asymptote equation is:

$$y = x - \lambda$$

Actually the control variable spans only in the positive branch of the hyperbola, so in the following only the upper section of the plot will be sketched.

The system evolves along f(x), iterating the system function, until it reaches the equilibrium point.

Stability analysis is carried out studying the behavior of the system function $y=f(x)$ around the fixed point x=0. The fixed point is a stable equilibrium point $$\text{if } \left|\frac{df(0)}{dx}\right| < 1$$

(Banach Fixed Point Theorem); after some simple calculation, we have:

$$\frac{df(x)}{dx} = 1 - \frac{\lambda \cdot \beta}{(1 + \beta \cdot x)^2}$$

Then the stability condition is easily evaluated:

$$0 < \lambda \cdot \beta < 2$$

Mapping the stability condition to the original state variable, the stability condition results:

$$0 < G < \frac{2 \cdot Tout}{N \cdot \kappa}$$

The behavior of the system function (the upper branch only) with $0<\lambda\cdot\beta<1$ is shown in FIG. 8. The slope in the origin $(1-\lambda\cdot\beta)$ is positive and less than one. This implies a monotone behavior of the control variable and then of the output frequency as well.

Figure 10:
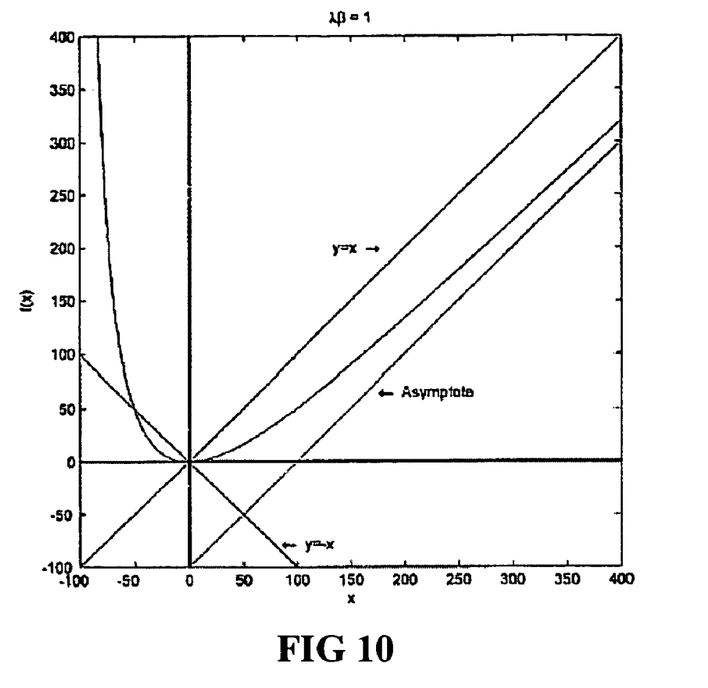
FIG. 10 shows the behavior of the system function (the upper branch only) with $\lambda\cdot\beta=1$.
Figure 11:
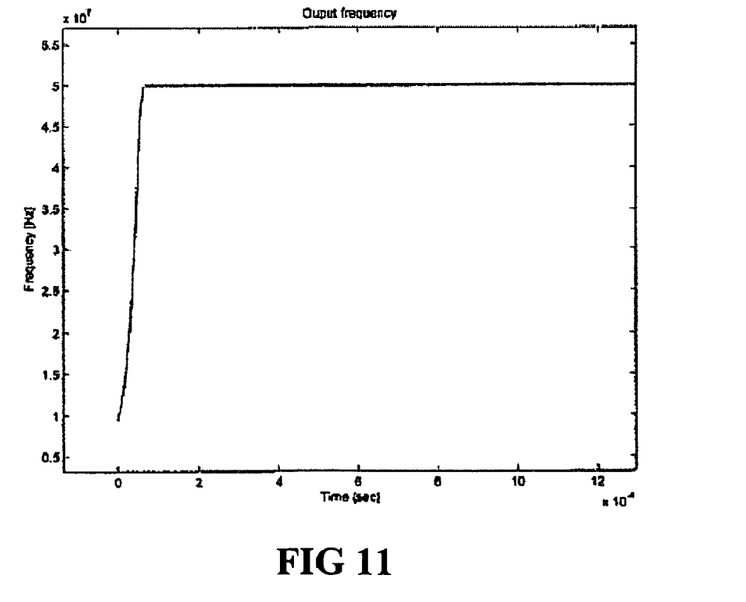
FIG. 11 shows the behavior of the system function (the upper branch only) with different values of $\lambda\cdot\beta=1$.

The behavior of the system function (the upper branch only) with $\lambda\cdot\beta=1$ is instead shown in FIG. 10. The slope in the origin $(1-\lambda\cdot\beta)$ is zero. This implies a monotone behavior of the control variable and the shortest time for reaching the equilibrium point. The situation is similar to the critical damping in a second order system.

Figure 12:
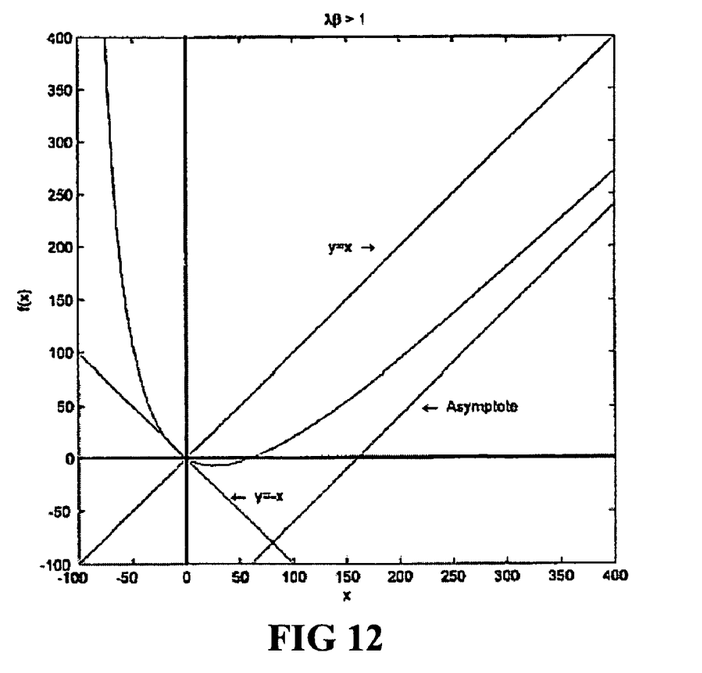
FIG. 12 shows the behavior of the system function (the upper branch only) with values of $1<\lambda\cdot\beta<2$.
Figure 13:
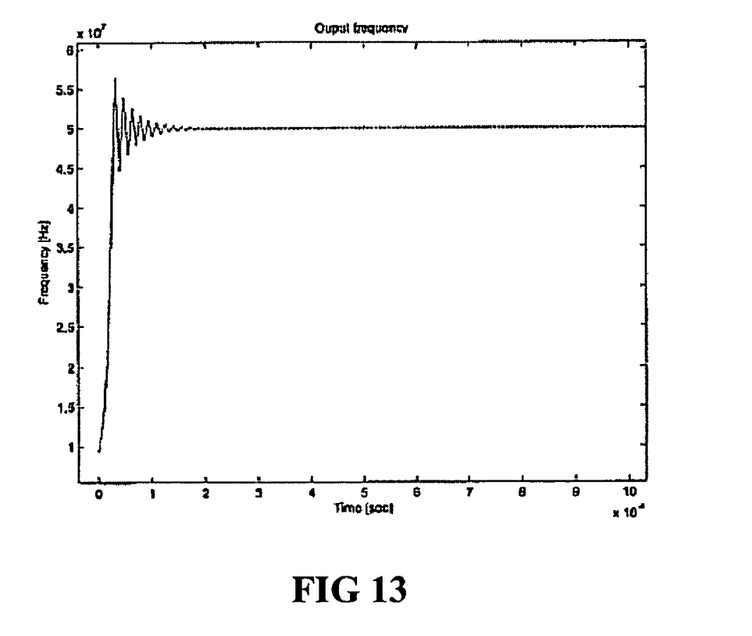
FIG. 13 shows the behavior of the system function (the upper branch only) with different values of $1<\lambda\cdot\beta<2$.

The behavior of the system function (the upper branch only) with $1<\lambda\cdot\beta<2$ is shown in FIG. 12. The evolution of the control variable is not monotonic anymore, but exhibits an oscillating behavior, due to the fact that around the origin the function assumes both positive and negative values.

Figure 14:
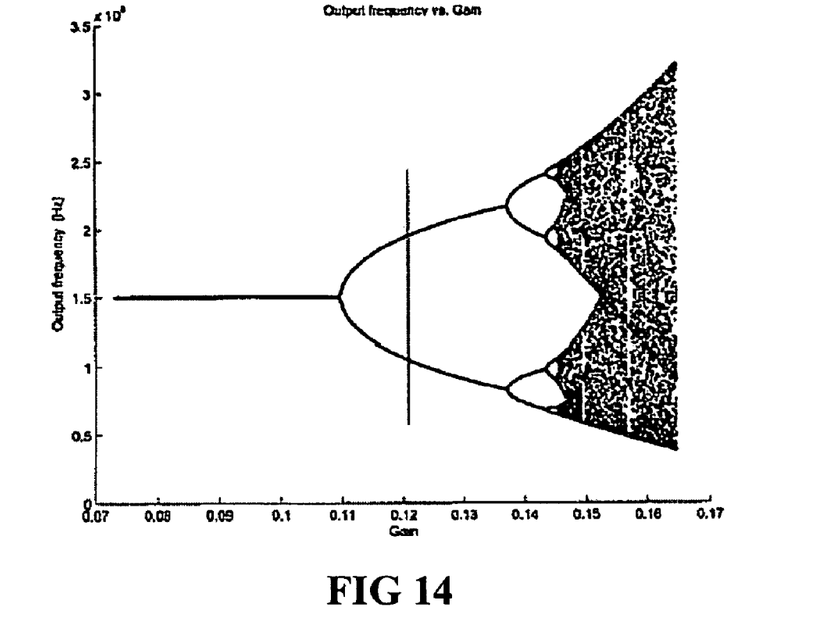
FIG. 14 shows the behavior of the output frequency versus the integrator gain.
Figure 15:
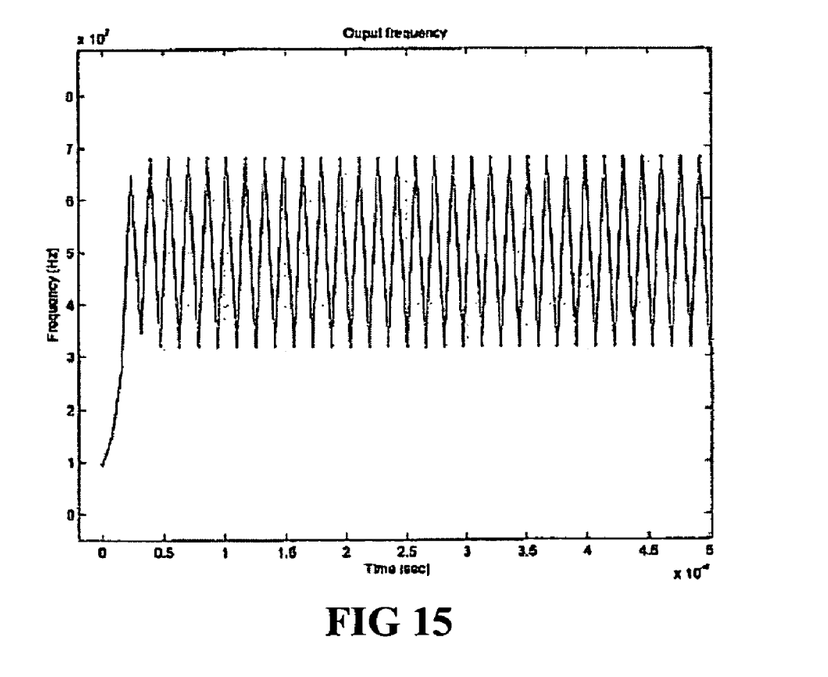
FIG. 15 shows frequency oscillating between two values for $\lambda\cdot\beta>2$.

The behavior of the output frequency vs. the integrator gain is shown in FIG. 14. Only one frequency is present, after transient completion, if G<0.11; two frequencies with 0.11<G<0.137; four frequencies for G0.137<G<0.144 and so on. Further increase in the gain produce an erratic behavior of the oscillation frequency. The bifurcation point G=0.11 corresponds to $\lambda \cdot \beta = 2$.

The lock speed of the FLL loop strongly depends on the reference clock, Fin. Indeed the feedback counter updates the error value once per Tin period. Another very critical parameter is the integrator gain. A too small value of G, even if safe from the stability point of view, slows down unacceptably the system. On the other side, a too high value of G can generate some stability problem, especially if the multiplication factor, N, is supposed to be programmable.

Due to the specific characteristic of the DCO, it is possible to identify the proper value of the state variable in two reference clock periods, Tin.

The control variable and the output clock period are linearly related. So, applying two different arbitrary codes, it is possible to set up a linear system in the variables $\tau$ and $\kappa$.

$$\begin{cases} \tau + \kappa \cdot u_1 = \dfrac{Tin}{n_1} \\ \tau + \kappa \cdot u_2 = \dfrac{Tin}{n_2} \end{cases}$$

Solving it for $\tau$ and $\kappa$ (through iterative methods, for instance), we can compute the fixed point state variable $$u^* = \frac{Tout - \tau}{\kappa} = \frac{1 - \tau \cdot Fout}{\kappa \cdot Fout}$$

Then, in 2 cycles of the reference clock, it is possible to get all the needed parameters and initialize the proper value of the control word: the transient time is completely skipped.

Even more, it is possible to identify the most appropriate value for the integrator gain:

$$G = \frac{Tout}{N \cdot \kappa}$$

After that the system can track the input clock frequency through the normal feedback control path.

In any case, if not strictly needed, the solution of the linear system can be avoided. The system converges in any case (selecting an appropriate gain G), to the correct control word.

The previous system has been fully simulated at system level (Matlab), both in floating and in fixed point implementation. Performances and behavior are fully in line with the above disclosure. The VHDL, synthesizable code of the system, for both the control and the DCO part, has been completed and it is fully working.

The implementation of a PLL system is straightforward, using the FLL architecture as a starting point. Another loop for the control of the relative phase of the feedback clock and the reference clock can be easily added, using, for instance, the usual PLL phase comparator.

A FLL or PLL according to embodiments of the present invention can be utilized in a variety of different types of integrated circuits, such as in microprocessors and digital signal processors. Integrated circuits including a FLL or PLL according to an embodiment of the present invention may be contained in a variety of different types of electronic systems, such as computer systems.

From the foregoing it will be appreciated that, although specific embodiments of the invention have been described herein for purposes of illustration, various modifications may be made without deviating from the spirit and scope of the invention.

The invention claimed is:

1. A system for clock synthesis for data timing recovery in very short lock time, of the type providing a high frequency output clock that is N times faster than a given reference clock, comprising:
   a feedback loop structure including a clock generator for generating a high frequency output clock;
   a clock divider for dividing by a factor N the frequency of the high frequency output clock from the clock generator;
   a frequency measure block for measuring the divided frequency;
   a comparator for comparing the measured frequency with a reference clock thus evaluating a frequency error;
   the value of the frequency error being used by a frequency control block to generate a control word for the selection of an oscillation output frequency; and
   wherein said feedback loop converges to a stable configuration having the frequency error approximately equal to zero and wherein the convergence to said stable configuration is obtained in two consecutive cycles of the reference clock, wherein each clock cycle comprises one and only one comparison by the comparator.

2. A system according to claim 1, wherein the system stability is independent of an intrinsic delay time of a ring oscillator.

3. A system according to claim 1, including a digital controlled oscillator (DCO) comprising a chain of buffers and an inverting stage, and wherein a delay of the chain of buffers in the ring can be changed accordingly to said control word modulating the oscillation output frequency.

4. A system according to claim 3, including in said loop an integrator control allowing said frequency control block to detect the control word for controlling said digital controlled oscillator independent of associated technology and physical parameters.

5. A system according to claim 1, wherein all the building blocks of said feedback loop belong to the digital discrete time domain.

6. A system according to claim 1, for realizing a Phase Locked Loop or a Frequency Locked Loop.

7. A frequency locked loop comprising:
   a clock generator circuit configured to generate an output clock signal in response to a control word, the output clock signal having a period that is a function of the control word;
   a clock divider and frequency measurement circuit coupled to the clock generator circuit and configured to generate a control variable corresponding to the measured ratio of the frequency of the output clock signal to the reference clock signal;
   a comparison circuit coupled to the clock divider and frequency measurement circuit and configured to subtract a target ratio of the frequency of the output clock signal to the reference clock signal from the control variable to generate a frequency error signal;

a frequency control circuit coupled to the comparison circuit and the clock generator circuit and configured to generate the control word applied to the clock generator circuit responsive to the frequency error signal from the comparison circuit, wherein each clock cycle of the reference clock comprises one and only one comparison by the comparison circuit.

8. The frequency locked loop system of claim 7 wherein the clock divider and frequency measurement circuit comprises a counter circuit operable to generate an output indicating the number of cycles of the output clock signal within a cycle of the reference clock signal.

9. The frequency locked loop system of claim 7 wherein the clock generator comprises:

a ring oscillator circuit including, an odd number of inverters coupled in series, a plurality of noninverting buffers coupled in series with the inverters, each inverter having an associated delay B and each buffer having an associated delay A, and wherein the ring oscillator circuit is operable responsive to the control word to adjust the number of buffers coupled in series with the inverters to control the frequency of the output clock signal, with the output clock signal being the signal developed on a node defined between two buffers, two inverters, or a buffer and an inverter in the ring oscillator circuit.

10. The frequency locked loop system of claim 7 wherein the frequency control circuit includes an integrator circuit that is utilized in developing the proper control word to be applied to the clock generator.

11. A frequency locked loop system comprising:

a clock generator configured to generate an output clock signal in response to a control word, the output clock signal having a frequency that is a function of the control word;

a clock divider coupled to the clock generator and configured to divide by a factor of N the frequency of the output clock signal to generate a divided clock signal;

a frequency measurement circuit coupled to the clock divider and configured to generate a measured value related to a frequency of the divided clock signal;

a comparison circuit adapted to receive a reference clock signal and configured to compare the reference clock signal to the measured value and to generate a frequency error signal responsive to the comparison; and a frequency control circuit coupled to the comparison circuit and the clock generator and configured to generate the control word applied to the clock generator, the control word having a value that causes the frequency error signal to have a zero value, and wherein the frequency control block includes, an integrator circuit that is utilized in developing the proper control word to be applied to the clock generator, and wherein the integrator circuit has a gain G having a value defined by the following relationship:

$$0 < G < \frac{2 \cdot T_{out}}{N \cdot \kappa}$$

where $T_{out}$ is the period of the output clock signal, N is the desired ratio between the frequencies of the output and reference clock signals, and $T_{out} = \tau + \kappa \cdot u$ where $\tau = 2 \cdot A$ and A is the delay of each buffer, where $\kappa = 2 \cdot B$ and B is the delay of each inverter, and u is the control word.

12. An integrated circuit comprising:

a clock generator configured to generate an output clock signal in response to a control word, the output clock signal having a frequency that is a function of the control word;

a clock divider coupled to the clock generator and configured to divide by a factor of N the frequency of the output clock signal to generate a divided clock signal;

a frequency measurement circuit coupled to the clock divider and configured to generate a measured value related to a frequency of the divided clock signal;

a comparison circuit adapted to receive a reference clock signal and configured to compare the reference clock signal to the measured value and to generate a frequency error signal responsive to the comparison; and a frequency control circuit coupled to the comparison circuit and the clock generator and configured to generate the control word applied to the clock generator, the frequency control circuit operable to determine a value for the control word in approximately two consecutive cycles of the reference clock signal, wherein each clock cycle of the reference clock comprises one and only one comparison by the comparator.

13. The integrated circuit of claim 12 wherein the integrated circuit comprises a microprocessor.

14. The integrated circuit of claim 13 further comprising an electronic system containing the integrated circuit.

15. The integrated circuit of claim 14 wherein the electronic system comprises a computer system.

16. A method comprising:

generating an output clock signal having a frequency that is a function of a control word;

generating a divided clock signal from the output clock signal, the divided clock signal having a frequency of the output clock signal divided by N;

generating a measured value using the frequency of the divided clock signal;

comparing a reference clock signal to the measured value;

generating an error signal responsive to the comparison; and generating the control word having a value that causes the frequency error signal to have a zero value in two consecutive comparisons of the reference clock signal to the measured value, wherein each clock cycle comprises one and only one comparison.

17. The method of claim 16 wherein generating an error signal responsive to the comparison comprises generating a frequency error signal indicating a frequency difference between the reference clock signal and the measured value.

18. The method of claim 16 wherein generating an error signal responsive to the comparison comprises generating a phase error signal indicating a phase error between the reference clock signal and the measured value.

* * * * *